ELECTRONICALLY TUNABLE PARAMETRIC AMPLIFIER OF EXTENDED TUNING RANGE WITH PUMP WAVE LOADING MEANS

Original Filed Sept. 29, 1961 3 Sheets-Sheet 1

INVENTORS:
HSIUNG HSU,
STEPHEN WANUGA,
BY Marvin L. Goldenberg
THEIR ATTORNEY.

INVENTORS:
HSIUNG HSU,
STEPHEN WANUGA,
BY Marvin L. Goldenberg
THEIR ATTORNEY.

INVENTORS:
HSIUNG HSU,
STEPHEN WANUGA,
BY Marvin ... Goldenberg
THEIR ATTORNEY.

United States Patent Office 3,320,542

Patented May 16, 1967

3,320,542

ELECTRONICALLY TUNABLE PARAMETRIC AMPLIFIER OF EXTENDED TUNING RANGE WITH PUMP WAVE LOADING MEANS

Hsiung Hsu, Columbus, Ohio, and Stephen Wanuga, Liverpool, N.Y., assignors to General Electric Company, a corporation of New York Continuation of application Ser. No. 141,873, Sept. 29, 1961. This application June 12, 1964, Ser. No. 376,294
6 Claims. (Cl. 330—4.6)

The present invention relates to novel tunable parametric amplifiers of extended tuning range, and in particular to traveling wave type parametric amplifiers having a narrow band width and which are electronically tunable over an extended frequency range. The present invention constitutes an improvement of an electronically tunable traveling wave parametric amplifier of the type disclosed in our copending application for U.S. Letters Patent entitled, "Electronically Tunable Parametric Amplifier," Ser. No. 88,535, filer Feb. 10, 1961, now Patent No. 3,193,772.

The present patent application is a continuation of applicants' copending application for U.S. Letters Patent, Ser. No. 141,873, filed Sept. 29, 1961, now abandoned, and assigned to the assignee of the present invention.

Parametric amplifiers are well known in the prior art to provide amplification of a high frequency signal of frequency $\omega_s$ by converting power to said signal from a second wave of a higher frequency, termed the pump frequency $\omega_p$. The signal frequency $\omega_s$ and the pump frequency $\omega_p$ are mixed in a nonlinear device. A resonant circuit is provided with said nonlinear device which resonates at the difference frequency of the two applied waves, conventionally termed the idler frequency $\omega_i$. The idler frequency is applied to the nonlinear device and mixed with the pump frequency to again obtain the signal frequency. Since the pump frequency is greater than the idler and signal waves, the flow of power in the system is from the pump to the idler to the signal wave, in accordance with known Manley-Rowe relations. The flow of power at the idler frequency introduces a negative resistance into the signal circuit so that the signal wave is taken at the output of the nonlinear device as an amplified signal. In the simple standing wave type amplifier, parametric amplification will occur so long as the relationship $\omega_p=\omega_s+\omega_i$ is satisfied.

Recently electronically tunable parametric amplifiers have been developed which employ traveling waves, as opposed to standing waves in cavity type amplifiers. By electronically tunable it is meant that the amplifier is tuned by varying the pump frequency with an electrical signal. By way of definition, traveling wave parametric amplifiers may be classified into essentially two categories: (a) the forward or simply traveling wave type parametric amplifier wherein the signal phase velocity $V_{\phi s}$ and the signal group velocity $V_{gs}$ are along the forward direction with respect to the pump wave, or are both of positive value, and (b) the backward traveling wave type parametric amplifier wherein $V_{\phi s}$ and $V_{gs}$ are along the backward direction with respect to the pump wave, or are both of negative value. In addition, there are what may be considered backward wave parametric amplifiers wherein $V_{\phi s}$ and $V_{gs}$ are of opposite sign.

Traveling wave parametric amplifiers are conventionally constructed of a transmission medium comprising, for example, a wave guide, strip line, coaxial cable, or combination thereof, which are periodically loaded with nonlinear reactance active elements, such as capacitors, reactance diodes, inductors or ferrite slabs. Whereas in a cavity type parametric amplifier interaction of the mixed frequencies occurs at the same one or two active elements disposed in a standing wave pattern during many cycles of operation, in the traveling wave type amplifier the interaction occurs at a large number of active elements, and usually each element is perturbed only once by each wave of the traveling waves as they are propagated through the transmission medium. Since traveling transmission media are able to support continuous bands of frequencies, electronic tuning of the amplifier over a wide band of frequencies can be accomplished. A further description of tunable parametric amplifiers may be found in an article by P. K. Tien entitled, "Parametric Amplification and Frequency Mixing in Propagating Circuits," appearing in the Journal of Applied Physics, vol. 29, No. 9, September, 1958, and a low frequency embodiment is described in an article by D. I. Brietzer and E. W. Sard entitled, "Low Frequency Prototype Backward Wave Reactance Amplifier," appearing in the Microwave Journal, vol 2, No. 8, August 1959.

In the prior art, as for example described in the aforementioned publications, it has been possible to tune the amplifier by maintaining the ratio of $\omega_i/\omega_s$ constant. Although this frequency constraint permits selective tuning, for high frequency signals in the order of hundreds of megacycles, the pump frequency, which is required to be considerably higher than the signal for good amplification, must be tuned over an exceedingly wide range for signal frequency variations. For example, if the signal frequency is varied from 250–500 megacycles, the pump frequency is required to vary by the same ratio from, let us say, 2000–4000 megacycles. Since there is an inherent limitation in the range of adjustment of such high frequency pump sources, the band through which the signal frequency can vary, and hence the amplifier tuning range, is accordingly limited.

The above referred to copending application Ser. No. 88,535 relates to traveling wavetype parametric amplifiers of various configurations in which the signal wave can be tuned over an enhanced tuning range. There is presented in said copending application the frequency and phase constant restraints required for effective parametric amplification of traveling waves, namely $$\omega_p=\omega_s+\omega_i \text{ and } \beta_p=\beta_s+\beta_i$$

where $\beta$ denotes the phase constant of the traveling waves. The tuning range is enhanced by maintaining operation of the idler wave at approximately constant frequency and varying the phase constant such that the above required constraints are always satisfield. In this manner, the pump frequency is required to vary by approximately the same amount as the signal frequency rather than by the same proportion as before. Thus, if the signal frequency is varied from 250 to 500 megacycles, the pump frequency need only change from 2000 megacycles to 2250 megacycles.

The present invention further improves the tuning capabilities of a traveling wave parametric amplifier providing a further enhancement of the signal frequency tuning range and permitting tuning of the signal wave at a higher frequency than previously realizable.

It is accordingly an object of the present invention to provide an improved electronically tunable parametric amplifier which may be employed to selectively amplify high frequency signals tunable over an enhanced frequency band.

A further object of the present invention is to provide a novel electronically tunable traveling wave parametric amplifier which can propagate a wide range of pump frequencies so as to permit signal tuning over an enhanced frequency band.

Another object of the present invention is to provide an improved electronically tunable parametric amplifier of the type above described having a reduced noise characteristic.

These and other objects of the invention are accomplished in one embodiment thereof which is in the form of a backward traveling wave parametric amplifier. The amplifier may be of the type which includes a wave guide structure in which is propagated a pump wave. Signal and idler waves may be propagated along a center conductor enclosed by the guide and running parallel to the longitudinal dimension thereof, the direction of the propagation of the signal wave being opposite to that of the pump. The amplifier is successively loaded by nonlinear reactance diodes which are coupled between the center conductor and the wide dimension walls of the wave guide at spaced intervals along the longitudinal dimension of the guide. The idler wave is produced by the interaction of the pump and signal waves across the reactance diodes. In order for parametric amplification to occur, the three waves must be related so that the following constraints are satisfied: (1) the pump frequency is equal to the signal frequency plus the idler frequency; and (2) the pump phase constant is equal to the signal phase constant plus the idler phase constant. The waves propagated by the wave guide and center conductor exhibit frequency versus phase constant functions which are determined by the properties of their respective transmission paths. The idler wave is preferably operated on the dispersive portion of the frequency versus phase constant function of the idler wave so that the signal can be tuned over a wide range while satisfying the above constraints. In addition to the nonlinear loading necessary for parametric amplification, in accordance with the present invention the pump wave alone is further successively loaded which expands the frequency versus phase constant function of the pump wave so that greater linear portion of the function and hence higher pump frequencies are available for the tuning operation. This has the desirable effect of both increasing the range over which the signal may be tuned and allowing for the tuning of a higher signal frequency. The additional loading of the pump wave is provided by a succession of loading stubs which are coupled between the wide dimension walls of the wave guide at points intermediate the reactance diodes, said loading stubs being positioned to have negligible loading effect on the center conductor.

In accordance with another aspect of the invention, there is provided a traveling wave parametric amplifier in which the pump wave is propagated through a wave guide structure, and the signal and idler waves are propagated along a longitudinal conductor which is enclosed in a compartment adjoining said wave guide structure. The conductor is electrically coupled to the energy propagated within said wave guide by successively spaced transverse conductors, said reactance elements successive-coupled between the longitudinal conductor and said transverse conductors, said reactance elements succesively loading the pump, signal and idler waves at spaced intervals along the longitudinal dimension of the wave guide, thereby effecting parametric amplification. In addition, loading stubs are coupled between the wide dimension walls of the wave guide at points intermediate the reactance diodes which stubs are essentially uncoupled from said transverse conductors so as to load only the pump wave.

While the specification concludes with claims particularly pointing out and distinctly claiming the subject matter which is regarded as the invention, it is believed that the invention will be better understood from the following description taken in connection with the accompanying drawings in which:

Figures 1, 4:
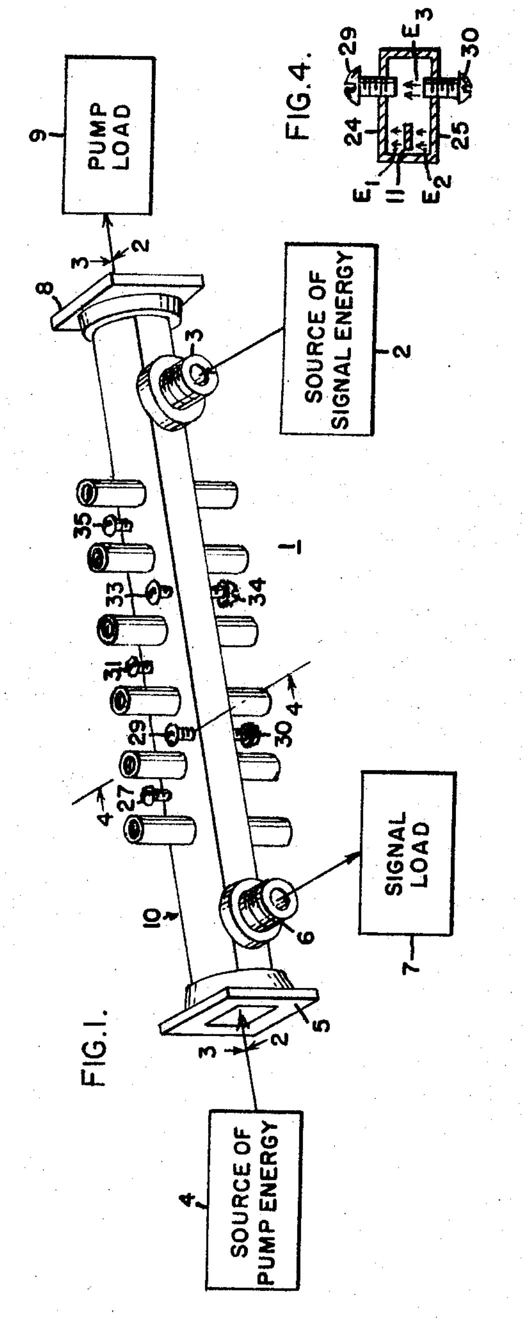
FIGURE 1 illustrates a perspective view of one embodiment of a backward traveling wave amplifier in accordance with the invention.
FIGURE 4 shows a cross-sectional view of the device of FIGURE 1 taken along the plane 4—4.

Referring now to FIGURE 1, there is illustrated a perspective view of an electronically tunable parametric amplifier device 1, operated as a backward traveling wave amplifier. The device has applied thereto a signal to be amplified and a pump wave which provides power to the signal. A source of signal energy 2, for example an antenna, applies the signal wave to a connector 3 of device 1, and a source of pump energy 4, which may be a voltage tunable magnetron, applies the pump wave to a connector 5. The amplifier signal appears at an output connector 6 and is applied to load 7. The pump wave output is coupled from connector 8 to a pump load 9.

Figures 2, 3:
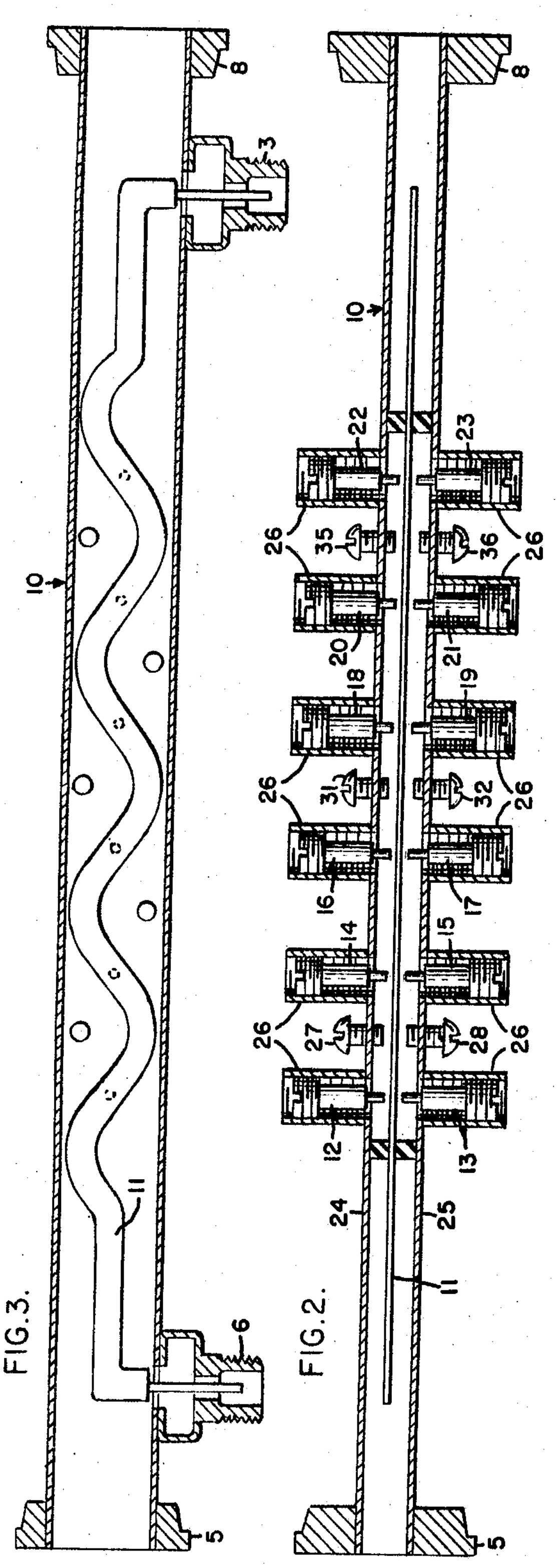
FIGURE 2 shows a cross-sectional view of the device of FIGURE 1 taken along the plane 2—2.
FIGURE 3 shows a cross-sectional view of the device of FIGURE 1 taken along the plane 3—3.

The amplifier device 1 includes a wave guide structure 10 which encloses a single conductor 11 positioned in the center of the guide 10 and running along the longitudinal dimension thereof, as shown in the cross-sectional view of FIGURES 2 and 3. The wave guide structure 10 supports propagation of the pump wave, and the center conductor 11 supports propagation of both signal and idler waves. The center conductor 11 is provided with periodic undulations, sinusoidal in form as illustrated in FIGURE 3, which increases the path length and thus decreases the velocity of the signal and idler waves in the longitudinal direction. Since the phase velocity is a function of the transmission medium, the phase velocities of the three waves can be predetermined. The phase velocities of the signal and idler waves as a function of frequency are equal in magnitude but opposite in direction. For tuning purposes the phase velocity of the pump wave is made greater than the velocity of the idler and signal waves. The relationship of the velocities of the three waves is important in the tuning of the amplifier and will be subsequently analyzed in detail when considering the Brillouin diagrams of FIGURES 6 and the tuning requirements.

The amplifier device 1 is periodically loaded by a plurality of pairs of reactance diodes 12–13, 14–15, 16–17, 18–19, 20–21 and 22–23 shown in FIGURE 2 which are coupled to the pump, signal and idler waves and across which the three waves are mixed to provide parametric amplification. The diodes are electrically coupled between the wide dimension walls 24 and 25 of the wave guide 10 and center conductor 11. The diodes are shown adjustably mounted by a plurality of threaded sleeves 26 which may be welded to the exterior of the walls 24 and 25. The diodes, of matched impedance characteristics for maximum signal amplification, are uniformly spaced and coupled to center points of conductor 11. In accordance with well known principles, the diodes are normally self-biased for operation in the backward direction.

In addition, there are provided pairs of capacitive loading stubs 27–28, 29–30, 31–32, 33–34 and 35–36 which are electrically coupled between the wide dimension walls 24 and 25, and positioned in such a manner as to periodically load the pump energy essentially without disturbing the field of the signal and idler energy.

As illustrated in the cross-sectional view of FIGURE 4, the center conductor is located in a plane midway between walls 24 and 25, in which plane the electric fields $E_1$ and $E_2$ between the conductor 11 and the walls 24 and 25, respectively, are balanced, so that the energy propagated by the conductor is isolated from the energy in the wave guide. This permits the pump, signal and idler energy upon traveling through the device 1 to react across the reactance diode loads in the prescribed manner so that power is transferred from the pump to the signal while ensuring that the pump and signal energy is uncoupled at the input and output terminals. The loading stubs, as shown by stubs 29–30, increase the electric field $E_3$ between the walls 24 and 25 so as to additionally load only the pump energy. The stubs are physically displaced in the transverse direction from the center conductor 11 so that fields $E_1$ and $E_2$ are negligibly affected by the loading stubs, and hence there is essentially no loading by the stubs of either the idler or signal waves. Thus, the pump wave is provided with loading at a periodic rate higher than that of the signal and idler waves. This allows improved tuning of the signal over a range in which the $\omega$–$\beta$ plot of the pump wave is substantially linear, as will be more clearly understood when considering the equivalent circuit of FIGURE 5 and the Brillouin diagrams of FIGURE 6.

Figure 5:
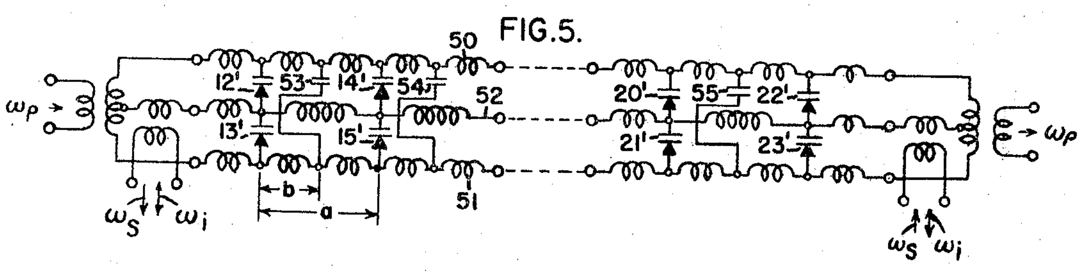
FIGURE 5 illustrates an equivalent circuit of the parametic amplifier of FIGURES 1–4.

Referring now to FIGURE 5, there is shown an equivalent circuit of the parametric amplifier device of FIGURES 1–4 in which a pair of parallel inductive transmission lines 50 and 51 represent the wave guide structure, and a third parallel inductive transmission line 52 represents the center conductor. Reactance diodes 12′, 13′, 14′, 15′, 20′, 21′, 22′ and 23′, corresponding to the diodes in FIGURE 2, into which is lumped distributed capacitance, are shown coupled between the outer transmission lines 50 and 51 and the center transmission line 52. Capacitances 53, 54 and 55 corresponding to the effective capacitance of the loading stubs in FIGURE 1, are shown coupled between the outer transmission lines 50 and 51. The pump wave is inductively coupled to the input of transmission lines 50 and 51, and the signal wave is inductively coupled to the input of the center transmission line 52. Inductive coupling is provided at the output of transmission lines 50 and 51 and at the output of line 52 for the exiting pump and signal waves, respectively. The idler wave is shown coupled to the signal wave circuit.

Figure 6:
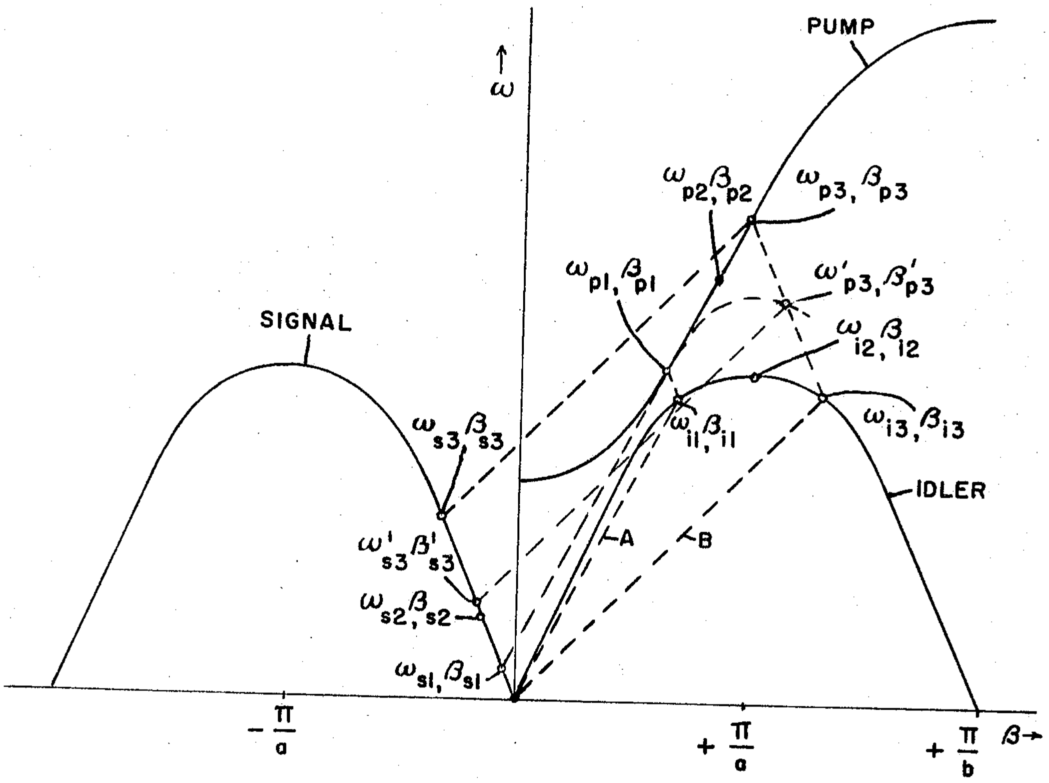
FIGURE 6 illustrates Brillouin diagrams for the three traveling waves in the amplifier of FIGURES 1–4 in which frequency $\omega$ is plotted versus phase constant $\beta$.

Let us now examine the Brillouin diagrams of FIGURE 6 in which the frequencies of the three traveling waves $\omega$ are plotted versus their phase constants $\beta$. The value of $\omega/\beta$ for the curves shown will be appreciated to be the phase velocity $V_\phi$ of the various waves transmitted through their respective transmission media. Further, it can be mathematically proven that the velocity of the energy of propagation in the longitudinal direction, or the group velocity $V_g$, is equal to the slope of the $\omega$–$\beta$ curves. Brillouin, or $\omega$ versus $\beta$, diagrams can be readily constructed for any given transmission medium by well known techniques, as disclosed, e.g., in D. A. Watkins' Topics in Electromagnetic Theory.

The $\omega$–$\beta$ curve for the signal wave is seen to be linear at the lower frequencies, exhibiting dispersion and becoming nonlinear at the upper frequency region. By dispersion it is meant that the slope of the curve is not equal to a constant, and coincidentally dispersion causes the slope to pass through a zero value where the frequency is constant for a changing phase constant. The dispersion in the upper frequency region is a function of the periodic reactive loading of the wave. It is seen that the zero slope of the signal $\omega$–$\beta$ curve occurs at a value of $$\beta=-\frac{\pi}{a}$$

where $a$ is the distance between the loading reactance diodes, as indicated in the equivalent circuit of FIGURE 5. The phase velocity $V_{\phi s}$ of the signal wave is negative. In accordance with the present embodiment, the phase velocity $V_{\phi i}$ of the idler wave, as a function of the frequency, is equal in magnitude and opposite in direction to $V_{\phi s}$, so that the $\omega$–$\beta$ curves for the two waves are the mirror image of each other, and accordingly the zero slope of the idler wave occurs at a value of $\beta=+\pi/a$. It may be appreciated that individual transmission paths may be employed for the signal and idler waves, in which instance the phase velocities of the signal and idler waves can be unequal.

The $\omega$–$\beta$ curve for the pump wave is dispersive in the lower frequency region due to cut-off properties of the wave guide in which it is propagated, becoming linear in an intermediate frequency range and again dispersive in the upper frequency region as a function of the periodic loading of the pump energy. It is seen that the zero slope of the curve in the upper frequency region occurs at a value of $\beta=+\pi/b$, where $b$ is the distance between the periodic loading elements applied to the pump wave, which is the distance between a loading stub and the adjacent reactance diode, as indicated in FIGURE 5. For values of $b=a/2$, the magnitude of $\beta$ of the pump wave is twice the magnitude of $\beta$ of the signal and idler waves at the zero slope points.

It may be analytically demonstrated that the value of $\beta$ at the zero slope points of the $\omega$–$\beta$ curves is a function of the loading periodicity from the following considerations. As is well known, the equivalent circuit of a transmission line may be considered as a succession of identical $\pi$ type LC circuits each composed of a single inductance L coupled at either end by a pair of capacitances C to a reference plane. The resonant frequency $\omega_r$ of each LC circuit may be defined as $$\omega_r=\frac{1}{\sqrt{L\cdot\frac{C}{2}}} \tag{1}$$

It will be appreciated that the resonant frequency corresponds to the frequency at which the slope of the $\omega$–$\beta$ curve of the transmission line is zero, the energy having zero velocity in the longitudinal direction at this frequency. Since the phase constant $\beta$ is defined as $\beta=2\pi/\lambda$, the coupled LC circuits at the resonant frequency have a value of $\beta=\pi/s$, where $s$ is the spatial dimension between capacitances, since there is a 180° phase shift between capacitances. By increasing the periodicity of the capacitive loading, so that the spatial dimension $s$ is decreased, the value of $\beta$ at the resonant frequency is seen to increase.

In addition an increase in the loading periodicity constitutes a decrease in the value of L and/or C in Equation 1, thereby increasing $\omega_r$ as well as $\beta$. For example, by loading with twice the number of capacitances all of the value C, thereby doubling the periodicity, the following expression for the new resonant frequency $\omega_r'$ is obtained:

$$\omega'_r=\frac{1}{\sqrt{\frac{L}{2}\cdot\frac{C}{2}}} \tag{2}$$

Thus, $$\omega'_r=\sqrt{2}\omega_r \tag{3}$$

A further increase in the periodicity provides a corresponding increase in the $\omega_r$. If the value of C of the additional loading is reduced, we have still a further increase in $\omega_r$.

In accordance with the above explanation, the $\omega$–$\beta$ curve for the pump wave is expanded by additional loading perturbation as shown in FIGURE 6, thereby providing an enhanced tuning range of the signal and a high idler frequency relative to the signal frequency, as will now be demonstrated.

Assume an initial signal frequency of $\omega_{s1}$ coupled to the input terminals of the amplifier. By tuning pump source 4 of FIGURE 1, the pump frequency is adjusted to $\omega_{p1}$ so as to provide an idler frequency $\omega_{i1}$ on the dispersive portion of the idler $\omega$–$\beta$ curve so that $\omega_{p1}=\omega_{s1}+\omega_{i1}$. By providing the proper relationship between the phase velocities of the three waves at the operation frequencies, the waves will also be related by $\beta_{p1}=\beta_{s1}+\beta_{i1}$, and parametric amplification occurs. It is seen that the operating points with the origin form a parallelogram A. The recited $\omega$ and $\beta$ constraints as well as the desired operation on the dispersive portion of the idler $\omega$–$\beta$ curve for improved tuning is described in detail in our above referred to copending application. It is noted that although operation on the dispersive portion of the idler $\omega$–$\beta$ curve is highly desirable, this invention is not dependent upon such operation and is of general advantage where an increased pump frequency is desired.

As $\omega_s$ changes, e.g., to $\omega_{s2}$, $\omega_p$ is changed by approximately the same amount to $\omega_{p2}$ and the idler frequency changes to $\omega_{i2}$, which is approximately equal to $\omega_{i1}$. At these points $\beta_{p2}=\beta_{s2}+\beta_{i2}$. As the signal changes to $\omega_{s3}$, $\beta_{s3}$, the pump is tuned to $\omega_{p3}$, $\beta_{p3}$ and the idler wave assumes a value of $\omega_{i3}$, $\beta_{i3}$ so that the $\omega$ and $\beta$ constraints are again satisfied, parallelogram B being drawn. From an inspection of the $\omega$–$\beta$ curves of FIGURE 6, it is seen that, over a given tuning range, the group velocities of the signal wave are different from the corresponding parametrically interacting group velocities of the idler wave, it being necessary that they be different in magnitude or direction, or both, in order that selective tuning of the signal be provided.

It is seen that by expanding the $\omega$–$\beta$ curve of the pump wave by additional loading of the pump energy so that the dispersive portion occurs at a higher value of $\omega$ and $\beta$, that part of the pump $\omega$–$\beta$ curve which is operated on is substantially linear. This provides access to higher pump frequencies which allow greater flexibility in determining the value of the idler phase velocity and frequency, and the advantage of tuning to a wider band of signal frequencies as well as to higher value signal frequencies. Thus, without the additional pump loading the upper frequency portion of the $\omega$–$\beta$ pump curve would be as shown by the dashed line with the zero slope occurring at $\beta=+\pi/a$. It is seen that operation on the dashed pump curve for the same idler operation provides a maximum pump frequency at $\omega_{p3}'$, $\beta_{p3}'$ and signal tuning from $\omega_{s1}$ to $\omega_{s3}'$, which is a range considerably narrower than the band $\omega_{s1}$ to $\omega_{s3}$. The increased perturbation of the pump wave has the additional advantage of permitting the idler frequency at the dispersive portion to be made greater, which provides a lower noise figure since the idler noise figure increases with the ratio of $\omega_s/\omega_i$. It may be appreciated that by increasing the slope of the positive linear portion of the idler $\omega$–$\beta$ curve so that the idler phase velocity approaches the pump phase velocity at the linear portions of their $\omega$–$\beta$ curves, the minimum signal frequency in the tuning band can be lowered.

To restate the advantages of the present invention, assume given transmission paths for the signal, pump and idler waves characterized by given $\omega$–$\beta$ curves for the three waves. If a maximum tuning range of the signal is desired especially having relatively high value upper frequencies, the phase velocity of the linear portion of the signal $\omega$–$\beta$ curve, which is approximately its slope in this portion, is required to be relatively high. Since the idler frequency must be higher than the signal frequency for desirable noise figure, it may be found that the required high pump frequencies necessary to tune the high signal frequencies are not available due to the dispersive portion of the pump $\omega$–$\beta$ curve. With additional perturbations of the pump energy which expands its $\omega$–$\beta$ curve, as explained heretofore, the required higher pump frequencies appearing now on the linear part of the pump $\omega$–$\beta$ curve can be reached for tuning to the higher signal frequencies. Since the lower portion of the $\omega$–$\beta$ curve is not effectively altered, lower signal frequencies can also be tuned by modifying the idler $\omega$–$\beta$ curve.

Figure 7:
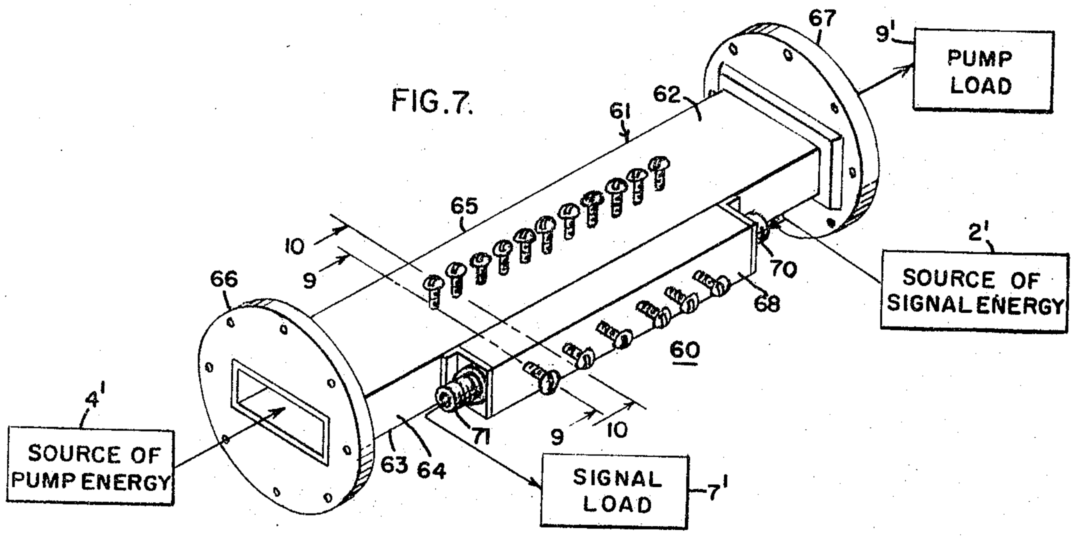
FIGURE 7 illustrates a perspective view of another embodiment of a traveling wave parametric amplifier in accordance with the invention.
Figure 8:
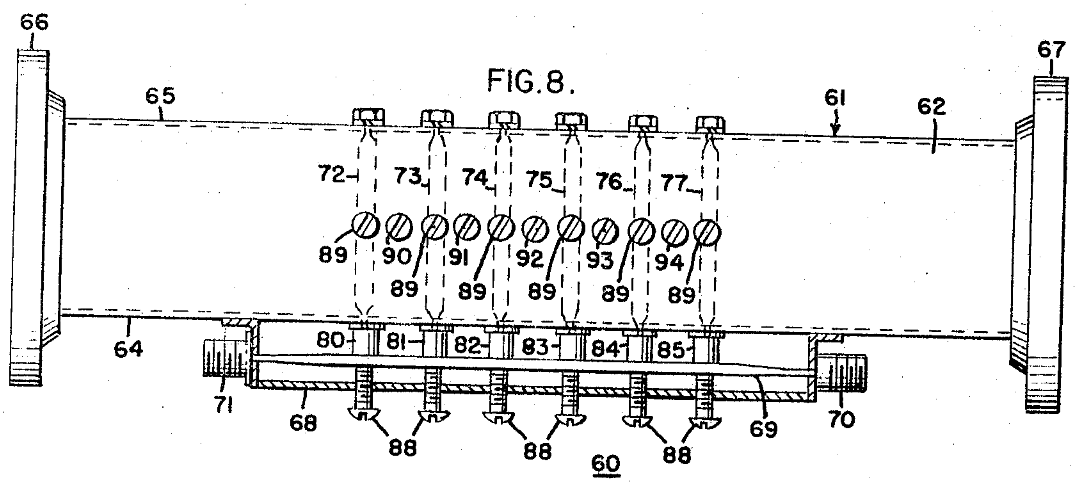
FIGURE 8 illustrates a plan view, partially broken away, of the device of FIGURE 7.
Figure 9:
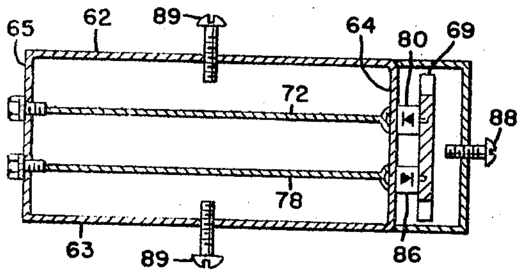
FIGURE 9 illustrates a cross-sectional view of the device of FIGURE 7 taken along the plane 9—9.
Figure 10:
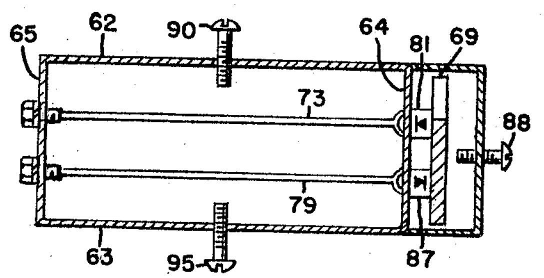
FIGURE 10 illustrates a cross-sectional view of the device of FIGURE 7 taken along the plane 10—10.

Referring now to FIGURE 7, there is illustrated in perspective view another embodiment of our invention, in which the transmission path for the signal and idler waves is structurally isolated from the pump wave. The amplifier device 60 includes a wave guide structure 61 composed of wide dimension walls 62 and 63 and narrow dimension walls 64 and 65, and having an input connector 66 and an output connector 67. A pump source 4', which may be identical to that shown in FIGURE 1, is connected to the input connector 66 for propagating the pump wave through the wave guide. The pump wave is terminated in a load 9' which is coupled to output connector 67. An enclosed compartment 68 is attached to the narrow dimension wall 64, which compartment encloses a center conductor 69 running axially through the compartment, as shown in FIGURES 8, 9 and 10. The center conductor 69 is provided with periodic undulations, similar to the conductor shown in FIGURE 3 and can support propagation of both the signal and idler waves. Compartment 68 has an input connector 70 and an output connector 71. A signal source 2', which may be identical to the signal source of FIGURE 1, is connected to input connector 70. The amplified signal is coupled from output connector 71 to signal load 7'.

Twelve transverse conductors arranged in pairs, of which 72, 73, 74, 75, 76, 77, 78 and 79 are shown in FIGURES 8, 9 and 10, are enclosed in the wave guide structure 61, running transversely across said wave guide parallel to the wide dimension walls 62 and 63 and secured to the narrow dimension walls 64 and 65. Twelve matched reactance diodes arranged in pairs of which 80, 81, 82, 83, 84, 85, 86 and 87 are shown in FIGURES 8, 9 and 10, are each coupled from center conductor 69 to a corresponding one of the transverse conductors. The diodes of each pair are poled in opposite directions. Each pair of diodes has coupled thereto tuning stubs 88 for matching the capacitive characteristics of the diodes. Twelve additional tuning stubs 89 are inserted through the wide dimension walls 62 and 63 into the hollow portion of the wave guide 61 and adjacent to the transverse conductors. These stubs disturb the fields within the guide so as to couple the pump energy to the transverse conductors. The pump, signal and idler waves react across the reactance diodes to provide parametric amplification, the pump energy being coupled to the diodes by the transverse conductors.

In addition, there are provided ten loading stubs arranged in pairs of which 90, 91, 92, 93, 94 and 95 are shown in FIGURES 8 and 10. The loading stubs are inserted in the walls 62 and 63 at points intermediate the stubs 89 and provide additional perturbations to the pump energy only since they are offset from the transverse conductors and effectively are not coupled to the signal and idler waves.

The operation of this embodiment of the present invention is similar to that of FIGURES 1 to 4. The transmission paths for the pump, signal and idler waves provide $\omega$–$\beta$ diagrams similar to those appearing in FIGURE 6, and tuning of the signal wave over an enhanced tuning range may be accomplished as previously explained.

Although our invention has been disclosed in specific configurations, this has been done primarily for the purpose of clearly setting forth the invention. It should be recognized, therefore, that the basic principles underlying the invention may be embodied in a number of other configurations without exceeding the teachings of the invention. Accordingly, the invention also has application to forward traveling parametric amplifiers, for example, of the type disclosed in our previously referred to copending application. In addition, although wave guides and strip line conductors have been employed in the illustrated embodiments, the invention has equal application to other forms of transmission lines in which traveling waves can occur as represented in the equivalent circuit of FIGURE 5.

Further, the loading reactance elements need not be periodically spaced as disclosed, which is primarily for the purpose of minimizing reflections of the propagated energy and to obtain uniform amplification over the tuning range of the signal frequency, but operation of the parametric device in accordance with the invention may also be accomplished with a non-uniform spacing of the reactance elements. Similarly, the additional loading stubs coupled to the pump energy need not be periodically spaced but may be of a random nature, although a uniform spacing may be desirable for good impedance matching. It should also be recognized that additional loading of the pump energy may be accomplished by either linear or nonlinear impedance means since the essential characteristic of this loading means is to control the dispersive property of the pump energy and is independent of any parametric amplification effects.

In addition, further perturbations of the pump wave may be had by increasing the number of loading stubs between successive reactance diodes, for example, making the dimension $b$ of FIGURE 5 equal to $a/3$, $a/4$ or smaller.

The appended claims are intended to include all such modifications as fall within the true scope and spirit of the invention.

What we claim as new and desire to secure by Letters Patent of the United States is:

1. A tunable traveling wave parametric amplifier comprising a multipath transmission line the paths of which support a signal wave of frequency $\omega_s$ and phase constant $\beta_s$, a pump wave of frequency $\omega_p$ and phase constant $\beta_p$ and an idler wave of frequency $\omega_i$ and phase constant $\beta_i$, where $\omega_p=\omega_s+\omega_i$ and $\beta_p=\beta_s+\beta_i$, said paths being constructed so as to provide signal group velocities that are different from corresponding parametrically interacting idler group velocities over the signal tuning range, loading means including nonlinear reactance means coupled to said paths for successively loading the pump wave at more frequent intervals than said signal and idler waves so as to extend the frequency range over which the pump wave can be propagated, said pump, signal and idler waves reacting across said nonlinear reactance means to provide, in response to adjustment of the pump frequency, parametric amplification of said signal wave over an enhanced range of signal frequencies.

2. A tunable traveling wave parametric amplifier comprising a multipath transmission line the paths of which support a signal wave of frequency $\omega_s$ and phase constant $\beta_s$, a pump wave of frequency $\omega_p$ and phase constant $\beta_p$ and an idler wave of frequency $\omega_i$ and phase constant $\beta_i$, where $\omega_p=\omega_s+\omega_i$ and $\beta_p=\beta_s+\beta_i$, said paths being constructed so as to provide signal group velocities that are different from corresponding parametrically interacting idler group velocities over the signal tuning range, a plurality of nonlinear reactance elements coupled to said paths for periodically loading said transmission line so as to effect parametric amplification of the signal wave, said nonlinear reactance elements causing dispersion in the $\omega$ versus $\beta$ function of said paths, where $\omega$ is the frequency and $\beta$ is the phase constant of the waves supported thereby, a plurality of additional impedance elements coupled to the pump path for providing loading of the pump wave at a greater periodicity than that of the signal and idler waves so that the near zero slope dispersive portion of the pump $\omega$ versus $\beta$ function occurs at increased values of $\omega$ and $\beta$, thereby extending the frequency range over which the pump wave can be propagated and providing tuning of the signal wave over an enhanced frequency band.

3. A tunable traveling wave parametric amplifier comprising a multipath transmission line, the paths of which support a signal wave of frequency $\omega_s$ and phase constant $\beta_s$, a pump wave of frequency $\omega_p$ and phase constant $\beta_p$ and an idler wave of frequency $\omega_i$ and phase constant $\beta_i$, where $\omega_p=\omega_s+\omega_i$ and $\beta_p=\beta_s+\beta_i$, said paths being constructed so as to provide signal group velocities that are different from corresponding parametrically interacting idler group velocities over the signal tuning range, a plurality of nonlinear reactance diode elements coupled to said paths at predetermined intervals for successively loading said transmission line so as to effect parametric amplification of the signal wave, said diode elements causing dispersion in the $\omega$ versus $\beta$ function of said paths, where $\omega$ is the frequency and $\beta$ is the phase constant of the waves supported thereby, additional impedance elements coupled to the pump path for providing loading of the pump wave at intervals more frequent than said predetermined intervals so that the near zero slope dispersive portion of the pump $\omega$ versus $\beta$ function occurs at increased values of $\omega$ and $\beta$, thereby extending the frequency range over which the pump wave can be propagated and providing tuning of the signal wave over an enhanced frequency band.

4. A tunable traveling wave parametric amplifier for amplifying a signal wave of frequency $\omega_s$ and phase constant $\beta_s$ by a mixing operation which converts power from a pump wave of frequency $\omega_p$ and phase constant $\beta_p$ through an idler wave of frequency $\omega_i$ and phase constant $\beta_i$, where $\omega_p=\omega_s+\omega_i$ and $\beta_p=\beta_s+\beta_i$ comprising a multipath transmission line the paths of which are constructed so as to provide signal group velocities that are different from corresponding parametrically interacting idler group velocities over the signal tuning range, said transmission line including a wave guide structure the walls of which enclose at least one conductor running longitudinally through said wave guide, said pump wave being propagated through said wave guide and said signal wave being propagated along said conductor, said idler wave being supported by one of the paths of said transmission line, a plurality of nonlinear reactance elements coupled between said conductor and the walls of said wave guide for successively loading the paths of said transmission line at predetermined intervals, said pump, signal and idler waves reacting across said nonlinear reactance means to provide parametric amplification of said signal wave, a plurality of additional impedance elements coupled between the walls of said wave guide and essentially uncoupled from said conductor for successively loading said pump wave at intervals more frequent than said predetermined intervals, whereby said wave guide propagates a wide range of pump frequencies so as to permit tuning of the signal wave over an enhanced frequency band.

5. A tunable traveling wave parametric amplifier for amplifying a signal wave of frequency $\omega_s$ and phase constant $\beta_s$ by a mixing operation which converts power from a pump wave of frequency $\omega_p$ and phase constant $\beta_p$ through an idler wave of frequency $\omega_i$ and phase constant $\beta_i$, where $\omega_p=\omega_s+\omega_i$ and $\beta_p=\beta_s+\beta_i$ comprising a multipath transmission line the paths of which are constructed so as to provide signal group velocities that are different from corresponding parametrically interacting idler group velocities over the signal tuning range, said transmission line including a wave guide structure the walls of which enclose at least one conductor of undulatory construction running longitudinally through said wave guide, said pump wave being propagated through said wave guide and said signal wave being propagated along said conductor, said idler wave being supported by one of the paths of said transmission line, a plurality of nonlinear reactance diode elements spaced along the length of the transmission line and coupled between said conductor and the walls of said wave guide for successively loading the paths of said transmission line at predetermined intervals so that said pump, signal and idler waves react across said diodes to provide parametric amplification of said signal wave, a plurality of loading stubs coupled between the walls of said wave guide, said loading stubs being positioned at points intermediate said diodes and transversely displaced therefrom so as to be essentially uncoupled from said conductor, said loading stubs providing a successive loading of the pump wave at intervals more frequent than said predetermined intervals, whereby said wave guide propagates a wide range of pump frequencies so as to permit tuning of the signal wave over an enhanced frequency band.

6. A tunable traveling wave parametric amplifier for amplifying a signal of frequency $\omega_s$ and phase constant $\beta_s$ by a mixing operation which converts power from a pump wave of frequency $\omega_p$ and phase constant $\beta_p$ through an idler wave of frequency $\omega_i$ and phase constant $\beta_i$, where $\omega_p=\omega_s+\omega_i$ and $\beta_p=\beta_s+\beta_i$ comprising a multipath transmission line the paths of which are constructed so as to provide signal groups velocities that are different from corresponding parametrically interacting idler group velocities over the signal tuning range, said transmission line including a wave guide structure having a pair of wide dimensioned walls and a pair of narrow dimensioned walls, an adjacent enclosed conductor in axial alignment with said wave guide structure, said pump wave being propagated through said wave guide and said signal wave being propagated along said conductor, a plurality of transverse conductors for supporting said idler wave coupled along the length of said wave guide between said narrow dimensioned walls, a plurality of nonlinear reactance elements coupled between said enclosed conductor and said transverse conductors for successively loading the paths of said transmission line at predetermined intervals, said pump, signal and idler waves reacting across said nonlinear reactance elements to provide parametric amplification of said signal wave, a plurality of additional impedance elements coupled between said wide dimensioned walls and essentially uncoupled from said transverse conductors for providing successive loading of said pump wave at intervals more frequent than said predetermined intervals, whereby said wave guide propagates a wide range of pump frequencies so as to permit tuning of the signal wave over an enhanced frequency band.

References Cited by the Examiner

UNITED STATES PATENTS

| | | | |
|---|---|---|---|
| 3,045,189 | 7/1962 | Engelbrecht | 330—4.6 |
| 3,193,772 | 7/1965 | Hsu et al. | |

ROY LAKE, *Primary Examiner.*

FREDERICK M. STRADER, D. R. HOSTETTER, *Assistant Examiners.*